United States Patent [19]
Ackley et al.

[11] Patent Number: 5,388,120
[45] Date of Patent: Feb. 7, 1995

[54] VCSEL WITH UNSTABLE RESONATOR

[75] Inventors: Donald E. Ackley, Lambertville, N.J.; Chan-Long Shieh, Paradise Valley; Michael S. Lebby, Apache Junction, both of Ariz.

[73] Assignee: Motorola, Inc., Schaumburg, Ill.

[21] Appl. No.: 124,065

[22] Filed: Sep. 21, 1993

[51] Int. Cl.⁶ .............................................. H01S 3/08
[52] U.S. Cl. .................................... 372/99; 372/45; 372/92; 372/95
[58] Field of Search .................. 372/92, 95, 99, 44, 372/45, 46

[56] References Cited
U.S. PATENT DOCUMENTS 5,115,441  5/1992  Kopf et al. ................. 372/92 X
5,226,053  7/1993  Cho et al. .................. 372/99 X

*Primary Examiner*—James W. Davie
*Attorney, Agent, or Firm*—Eugene A. Parsons

[57] ABSTRACT

A vertical cavity laser with unstable resonator including a substrate having opposed major surfaces with a first semiconductor mirror stack positioned on one major surface of the substrate, an active region positioned on the first stack and a second semiconductor mirror stack positioned on the active region so as to sandwich the active region between the first and second stacks. Layers of the second stack being etched so as to spatially modulate the thickness of the second stack such that reflectivity is reduced in a central portion of the second stack and increases toward an edge thereof.

12 Claims, 1 Drawing Sheet

VCSEL WITH UNSTABLE RESONATOR

FIELD OF THE INVENTION

The present invention pertains to vertical cavity surface emitting lasers and more specifically to vertical cavity lasers with improved operating characteristics.

BACKGROUND OF THE INVENTION

Conventional edge emitting semiconductor lasers are playing a significant role in development of optical communications due to their high operating efficiency, small size and modulation capabilities. However, with increasing performance needs, further reduction in size, and greater manufacturing needs, these devices have been experiencing limitations.

Recently, there has been an increased interest in a new type of laser device called a vertical cavity surface emitting laser (VCSEL). Advantages of VCSEL devices are that the device is smaller, has potentially higher performance, and is potentially more manufacturable. These advantages are due in part from advances in epitaxial deposition techniques such as metal organic vapor phase epitaxy (MOVPE) and molecular beam epitaxy (MBE).

However, even with these advances in deposition techniques there is difficulty during manufacturing in controlling the mode of operation of the laser and in controlling current distribution within the laser. In general, VCSELs are formed by depositing a plurality of layers on a substrate and then etching the layers down to the substrate to form the VCSEL. See, for example, U.S. Pat. No. 5,034,092, entitled "Plasma Etching of Semiconductor Substrates" issued Jul. 23, 1991, assigned to the same assignee and included herein by reference.

The etching of mesas to form VCSELs has two disadvantages. The etching process damages the crystal at the surface and leads to increased threshold currents and reduced reliability. The mesas form a waveguide with a large discontinuity in the refractive index which makes it very difficult to control the optical modes without making devices of very small dimension, which increases the series resistance and reduces the maximum output power. Generally this results in devices which are less efficient and less stable. Other problems include thermal changes during operation which alter thicknesses and current flow to produce changes known as self-focusing effects. These self-focusing effects, along with others, either reduce the optical mode size or cause higher order mode operation.

Another problem in VCSELs is the series resistance between electrical contacts. As the number of layers in the mirror stacks increases, the series resistance increases which reduces the efficiency of the VCSEL.

Accordingly, it is a purpose of the present invention to provide a new and improved vertical cavity laser.

Another purpose of the present invention is to provide a new and improved vertical cavity laser with a larger mode size.

It is still another purpose of the present invention to provide a new and improved vertical cavity laser with reduced series resistance.

It is a further purpose of the present invention to provide a new and improved method of fabricating vertical cavity lasers.

SUMMARY OF THE INVENTION

The above problems and others are at least partially solved and the above purposes and others are realized in a vertical cavity laser with unstable resonator including a first semiconductor mirror stack, a plurality of semiconductor layers forming an active region positioned on the first semiconductor mirror stack, a second semiconductor mirror stack positioned on the active region so as to sandwich the active region between the first and second semiconductor mirror stacks. The second semiconductor mirror stack is formed with more semiconductor layers adjacent the edges of the second semiconductor mirror stack than in a central portion thereof so as to spatially modulate the thickness of the second semiconductor mirror stack such that reflectivity is reduced in the central portion of the second semiconductor mirror stack and increases toward the edge.

The above problems and others are at least partially solved and the above purposes and others are further realized in a method of fabricating a vertical cavity laser with unstable resonator comprising the steps of providing a substrate having first and second opposed major surfaces with a first semiconductor mirror stack on the first major surface of the substrate, an active region positioned on the first semiconductor mirror stack and a second semiconductor mirror stack positioned on the active region so as to sandwich the active region between the first and second semiconductor mirror stacks. The second semiconductor mirror stack is then etched so that the second semiconductor mirror stack contains more semiconductor layers adjacent edges of the second semiconductor mirror stack than in a central portion thereof, resulting in increased reflectivity adjacent the edges and reduced series resistance in the central portion. An electrical contact is positioned in the central portion.

BRIEF DESCRIPTION OF THE DRAWINGS

Referring to the drawings wherein like characters indicate like parts throughout the various figures.

DESCRIPTION OF THE PREFERRED EMBODIMENTS

Figure 1:
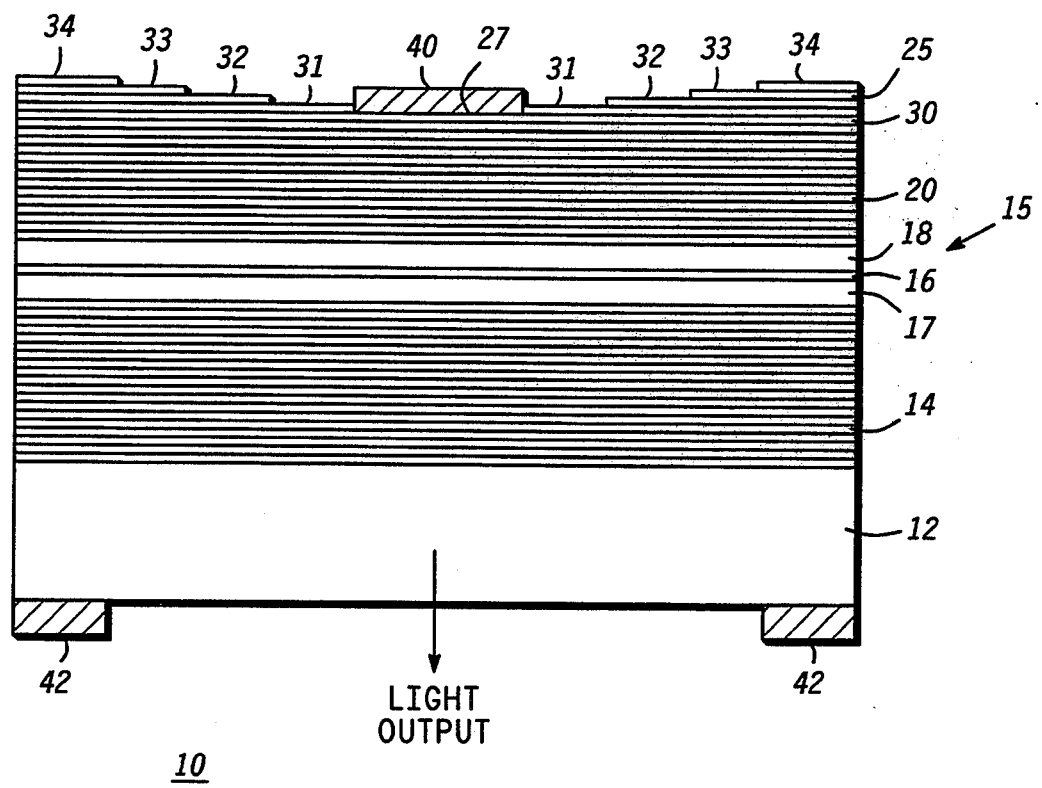
FIG. 1 is a simplified cross-sectional view of a vertical cavity laser embodying the present invention.

Referring specifically to FIG. 1, a vertical cavity laser (VCSEL) 10 is illustrated, embodying the present invention. A substrate 12 of a suitable material for forming the various layers comprising VCSEL 10 is provided. Generally, the various layers are formed by epitaxial deposition accomplished by well known techniques in the art such as MBE, MOCVD, CBE, or the like. These techniques enable epitaxial depositions of relatively thin and thick layers of materials such as gallium arsenide, aluminum gallium arsenide, aluminum arsenide, silicon, indium gallium arsenide, etc.

Substrate 12 of any convenient material is provided. Generally, substrate 12 is gallium arsenide (GaAs) or the like which, as will be understood presently, is compatible with layers subsequently grown thereon. A first semiconductor Bragg mirror stack 14 is grown on an upper surface of substrate 12. In this embodiment, first mirror stack 14 is grown by deposition of alternating layers of N doped aluminum gallium arsenide with low (<15%) and high (>80%) aluminum mole fractions. Thicknesses of alternating layers of aluminum gallium arsenide are set at approximately one quarter of the wavelength at which VCSEL 10 is designed to operate.

An active area 15, generally containing at least one and usually a plurality of quantum wells 16 and lower and upper cladding regions 17 and 18, respectively, on either side of quantum wells 16, is grown on first semiconductor mirror stack 14. A second semiconductor Bragg mirror stack 20 is epitaxially deposited on the second cladding region of active and spacer layer 15. Second semiconductor mirror stack 20 is composed of alternating layers of P doped aluminum gallium arsenide with alternating mole fractions as used in first semiconductor mirror stack 14. Generally, as described above, first semiconductor mirror stack 14, active area 15 and second semiconductor mirror stack 20 are grown on substrate 12 epitaxially. The formation of first semiconductor mirror stack 14, active area 15 and second semiconductor mirror stack 20 is well known in the art and will not be elaborated upon further in this disclosure. Generally, the threshold current of a VCSEL is reduced by increasing the number of alternating layers in semiconductor mirror stacks 14 and 20.

Once first semiconductor mirror stack 14, active area 15 and second semiconductor mirror stack 20 are completed, the structure is patterned to form one or more individual VCSELs. In the present specific embodiment the patterning is accomplished as follows. The upper surface of second semiconductor mirror stack 20 is provided with a layer of photoresist material in any of the well known methods. The photoresist layer is exposed and material is removed to define the position and size of a trench. The trench is then formed by etching the semiconductor mirror stacks by any convenient means, such as ion milling or the etch processes disclosed in U.S. Pat. No. 5,034,092, entitled "Plasma Etching of Semiconductor Substrates" issued Jul. 23, 1991 and assigned to the same assignee. In general, the trench extends completely around and defines a generally mesa shaped area, which in this specific embodiment has a generally circular cross-section.

In the field of VCSELs if the semiconductor mirror stacks are etched completely through to the substrate the laser is sometimes referred to as a "mesa device" and if the etching is performed partially through the upper semiconductor mirror stack the laser is sometimes referred to as a "ridge-guide device". In this disclosure either type of etching could be performed and, therefore, the etched area is referred to throughout as a trench and the area defined by the trench is referred to as a mesa shaped area. The present invention will improve the operation of either of these configurations, but the mesa device is the simplest for explanation purposes and, accordingly, that is the device that will be described in detail with the application to other devices being understood.

The operating wavelength (frequency) of VCSEL 10 is determined by the construction (material, etc.) and dimensions of active area 15 and the dimensions of semiconductor mirror stacks 14 and 20. Further, as is well known in the art, VCSELs are desired to operate in a lowest order mode. The mode size, or the maximum volume that can be utilized to sustain the lowest order mode of operation is generally determined by the optical characteristics of the semiconductor mirror stacks 14 and 20. The diameter of the mesa shaped area is generally approximately the greatest area that will support operation in the lowest order mode without including any higher order modes of operation. Also, the width of the trench surrounding and defining the mesa is not crucial and may be any convenient width, depending upon the application and the following manufacturing steps.

Figure 2:
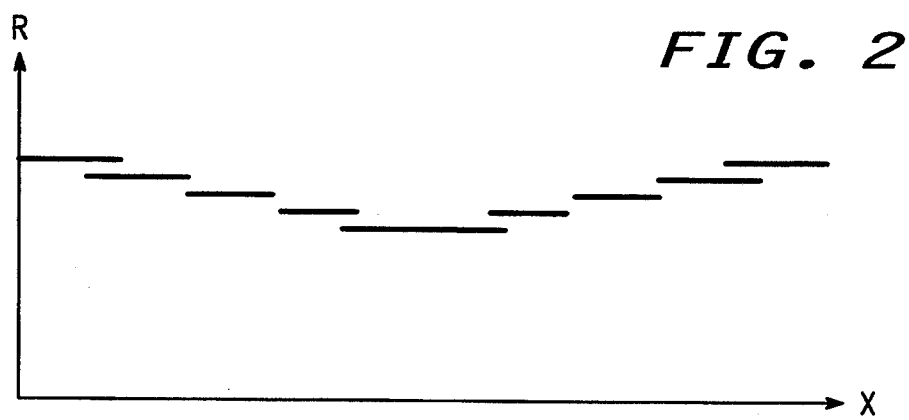
FIG. 2 is a graphical representation of reflectivity versus spatial position in the vertical cavity laser of FIG. 1.

Once first semiconductor mirror stack 14, active area 15 and second semiconductor mirror stack 20 are completed, second semiconductor mirror stack 20 is patterned, or etched so that the number of layers at outer edge 25 of VCSEL 10 are greater than the number in a central portion 27, with a gradual change in the number of layers. In this specific embodiment, a semiconductor layer 30 is the uppermost complete semiconductor layer in second semiconductor mirror stack 20. One or more semiconductor layers 31 are selectively deposited, or etched, to form a first step within which central portion 27 of semiconductor layer 30 is exposed. One or more semiconductor layers 32, 33 and 34 are selectively deposited, or etched, to form second, third and forth steps, respectively, each spaced outwardly toward edge 35 from the previous step. The modification in the number of layers in semiconductor mirror stack 20 results in increased reflectivity at edge 25 as is plotted in FIG. 2. Reflectivity, R, versus spatial distance, X, is plotted in FIG. 2, generally from the left edge of VCSEL 10 in FIG. 1 to the right edge. The reflectivity of semiconductor mirror stack 20 is determined by the total number of layers in semiconductor mirror stack 20 and, thus, the reflectivity is spatially modulated by the selective deposition or etching process. Here it should be understood that the number of steps utilized will depend upon the specific reflectivity profile, or spatial modulation, desired.

Where it is desired to deposit the layers of semiconductor mirror stack 20 by selective deposition, this is accomplished by utilizing sequential masking and deposition steps in a well known manner. If it is desired to etch layers already deposited, this can be achieved, for example, by using a focused ion beam etching system. Another etching procedure that can be utilized is to holographically expose phase gratings on the wafer which includes VCSEL 10 and then chemically etching the semiconductor layers. Also, sequential masking and etching step can be utilized in a well known manner.

Since the reflectivity is spatially modulated so as to be reduced in central portion 27, the optical mode of VCSEL 10 is forced outwardly from central portion 27 by increasing the diffraction of the mode. Forcing the optical mode outwardly leads to a larger mode size than would be available using simple flat semiconductor layers. For a gain guided device, this tendency to expand the mode counters the mode contraction caused by thermal effects, leaving VCSEL 10 operating in a large fundamental mode. When the semiconductor layers are etched in high-low index (high and low aluminum mole fractions) pairs of semiconductor layers, each pair represents a half-wavelength (at the lasing frequency) increment or change in optical thickness, which results in affecting only the magnitude of the reflectivity. If the semiconductor layers are etched singly, i.e., in quarter-wavelength increments, the phase of semiconductor mirror stack 20 is affected as well as the magnitude and larger and/or different changes result. Here it is believed that the number and size of increments in the reflectivity profile can be fabricated to have the effect of acting as a binary lens to focus or defocus emitted radiation.

In this specific embodiment, VCSEL 10 emits radiation (light) downwardly in FIG. 1 through substrate 12. An upper electrical contact 40 is positioned in overlying relationship in the central portion 27 on the exposed surface of semiconductor layer 30. Electrical contact 40 is formed smaller than patterned semiconductor layer 31, which results in improved overlap of the lasing mode with current distribution that includes spreading. A second electrical contact 42 is positioned on the lower surface of substrate 12 so as to generally encircle the light output area. Since the required threshold gain increases slightly for each increment that the semiconductor layers are etched, but at the same time the injected current density (and hence, the gain) is also higher in the center, the optical mode is optimized to the injected current for maximum mode size and efficiency. A further benefit realized from forming second semiconductor mirror stack 20 with a larger number of semiconductor layers adjacent edge 25 is that electrical contact 40 is closer to active area 15, resulting in a reduced series resistance.

Thus, a new and improved vertical cavity laser is disclosed with a larger mode size, improved efficiency and reduced series resistance. Further a new and improved method of fabricating vertical cavity lasers to provide vertical cavity lasers with a larger mode size, improved efficiency and reduced series resistance is disclosed. In addition, a new and improved method of fabricating vertical cavity lasers to provide the effect of a binary mirror in one of the stacks to focus emitted radiation in a predetermined pattern is disclosed.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. An unstable resonator for a vertical cavity laser including a first semiconductor mirror stack, a plurality of semiconductor layers forming an active region positioned on the first semiconductor mirror stack, a second semiconductor mirror stack positioned on the active region so as to sandwich the active region between the first and second semiconductor mirror stacks, and the second semiconductor mirror stack being formed with more semiconductor layers adjacent an edge of the second semiconductor stack than in a central portion thereof so as to spatially modulate the reflectivity of the second semiconductor mirror stack such that reflectivity is reduced in the central portion of the second semiconductor mirror stack and increases toward the edge.

2. An unstable resonator for a vertical cavity laser as claimed in claim 1 including in addition an electrical contact positioned on the second semiconductor mirror stack in overlying relationship to the central portion thereof.

3. An unstable resonator for a vertical cavity laser as claimed in claim 1 wherein the semiconductor layers in the second semiconductor mirror stack increase from the central portion to the edge in a plurality of steps.

4. An unstable resonator for a vertical cavity laser comprising:
   a substrate having first and second opposed major surfaces;
   a first semiconductor mirror stack positioned on the first major surface of the substrate;
   a plurality of semiconductor layers forming an active region, the active region being positioned on the first semiconductor mirror stack;
   a second semiconductor mirror stack positioned on the active region so as to sandwich the active region between the first and second semiconductor mirror stacks; and
   the second semiconductor mirror stack being formed with a larger number of semiconductor layers adjacent edges of the second semiconductor mirror stack than in a central portion thereof.

5. An unstable resonator for a vertical cavity laser as claimed in claim 4 wherein the number of semiconductor layers in the second semiconductor mirror stack increases from the central portion to the edge in a plurality of steps.

6. An unstable resonator for a vertical cavity laser as claimed in claim 5 wherein each of the plurality of steps is approximately equal to one-half of a wavelength at the lasing frequency.

7. An unstable resonator for a vertical cavity laser as claimed in claim 5 wherein each of the plurality of steps is approximately equal to one-quarter of a wavelength at the lasing frequency.

8. An unstable resonator for a vertical cavity laser as claimed in claim 5 wherein each of the plurality of steps is selected so that they cooperate to provide the effect of a binary mirror to focus emitted radiation in a predetermined pattern.

9. An unstable resonator for a vertical cavity laser as claimed in claim 4 including in addition an electrical contact positioned on the second semiconductor mirror stack and light is emitted through the second major surface of the substrate.

10. An unstable resonator for a vertical cavity laser as claimed in claim 9 wherein the electrical contact is positioned to overlie the central portion of the second semiconductor mirror stack.

11. An unstable resonator for a vertical cavity laser as claimed in claim 9 including in addition a second electrical contact positioned on the second major surface of the substrate.

12. An unstable resonator for a vertical cavity laser as claimed in claim 4 wherein the plurality of semiconductor layers forming an active region include a central region having at least one quantum well formed therein and a cladding layer formed on opposite sides thereof.

* * * * *